United States Patent
Searles et al.

(10) Patent No.: US 7,924,637 B2
(45) Date of Patent: Apr. 12, 2011

(54) METHOD FOR TRAINING DYNAMIC RANDOM ACCESS MEMORY (DRAM) CONTROLLER TIMING DELAYS

(75) Inventors: Shawn Searles, Austin, TX (US);
Tahsin Askar, Round Rock, TX (US);
Thomas H. Hamilton, Manor, TX (US);
Oswin Housty, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 333 days.

(21) Appl. No.: 12/059,653

(22) Filed: Mar. 31, 2008

(65) Prior Publication Data
US 2009/0244997 A1    Oct. 1, 2009

(51) Int. Cl.
*G11C 7/00* (2006.01)
(52) U.S. Cl. .............. 365/194; 365/189.07; 365/233.13; 365/233.16; 365/233.17; 365/233.18
(58) Field of Classification Search .................. 365/194, 365/189.07, 233.16, 233.17, 233.18, 233.13
See application file for complete search history.

(56) References Cited

U.S. PATENT DOCUMENTS

| | | | |
|---|---|---|---|
| 5,373,255 A | 12/1994 | Bray et al. | |
| 5,440,515 A | 8/1995 | Chang et al. | |
| 5,857,095 A | 1/1999 | Jeddeloh et al. | |
| 6,691,214 B1 | 2/2004 | Li et al. | |
| 6,791,889 B2 | 9/2004 | Peterson | |
| 6,873,564 B2 * | 3/2005 | Roohparvar | 365/230.03 |
| 6,930,932 B2 | 8/2005 | Rentschler | |
| 7,038,971 B2 | 5/2006 | Chung | |
| 7,061,941 B1 | 6/2006 | Zheng | |
| 7,117,381 B2 | 10/2006 | Kim et al. | |
| 7,184,323 B2 | 2/2007 | Fujisawa | |
| 7,304,910 B1 * | 12/2007 | Hanzawa et al. | 365/233.18 |
| 7,321,525 B2 * | 1/2008 | Matsui | 365/233.12 |
| 7,457,174 B2 | 11/2008 | Braun et al. | |
| 7,487,378 B2 * | 2/2009 | Morein et al. | 713/503 |
| 7,518,946 B2 | 4/2009 | Iwasaki | |
| 2002/0147892 A1 | 10/2002 | Rentschler et al. | |
| 2002/0147896 A1 | 10/2002 | Rentschler et al. | |
| 2003/0021164 A1 | 1/2003 | Yoo et al. | |
| 2004/0143775 A1 | 7/2004 | Li et al. | |
| 2005/0197082 A1 | 9/2005 | Agostinelli | |
| 2005/0204245 A1 | 9/2005 | Lee et al. | |

(Continued)

FOREIGN PATENT DOCUMENTS
WO    2008/063199 A1    5/2008

OTHER PUBLICATIONS

International Search Report in application No. PCT/US2009/003220 mailed Sep. 15, 2009, 12 pages.

(Continued)

*Primary Examiner* — Pho M Luu
*Assistant Examiner* — Tha-O Bui

(57) ABSTRACT

Timing delays in a double data rate (DDR) dynamic random access memory (DRAM) controller (114, 116) are trained. A left edge of passing receive enable delay values is determined (530). A final value of a receive data strobe delay value and a final value of a transmit data delay value are trained (540). A right edge of passing receive enable delay values is determined using a working value of the receive data strobe delay (550); and a final receive enable delay value intermediate between the left edge of passing receive enable delay values and the right edge of passing receive enable delay values is set (560).

23 Claims, 7 Drawing Sheets

U.S. PATENT DOCUMENTS

| | | |
|---|---|---|
| 2005/0243608 A1 | 11/2005 | Lee |
| 2006/0114742 A1 | 6/2006 | Salmont et al. |
| 2006/0133158 A1 | 6/2006 | Shin |
| 2006/0262613 A1 | 11/2006 | Braun et al. |
| 2007/0036020 A1* | 2/2007 | Lee et al. ............... 365/230.03 |
| 2007/0217559 A1 | 9/2007 | Stott et al. |
| 2009/0086562 A1 | 4/2009 | Richards |
| 2009/0244995 A1 | 10/2009 | Searles et al. |
| 2009/0244996 A1 | 10/2009 | Searles et al. |
| 2009/0245010 A1 | 10/2009 | Searles et al. |
| 2009/0296501 A1 | 12/2009 | Searles |

OTHER PUBLICATIONS

"Double Data Rate (DDR) SDRAM Specification," JESD79, Release 2, JEDEC Solid State Technology Association, JEDEC Standard, Electronics Industries Alliance, May 2002.

U.S. Appl. No. 12/059,613, Office Action mailed Apr. 7, 2010, 6 pages.

U.S. Appl. No. 12/059,641, Office Action mailed Apr. 1, 2010, 14 pages.

U.S. Appl. No. 12/059,593, Notice of Allowance mailed Apr. 9, 2010, 8 pages.

U.S. Appl. No. 12/059,641 Notice of Allowance mailed Aug. 19, 2010, 10 pages.

U.S. Appl. No. 12/059,593 Notice of Allowance mailed Jul. 23, 2010, 8 pages.

U.S. Appl. No. 12/127,059 Non-Final Office Action mailed Sep. 2, 2010, 8 pages.

U.S. Appl. No. 12/059,613 Final Office Action mailed Jul. 27, 2010, 9 pages.

U.S. Appl. No. 12/059,641 Notice of Allowance mailed Nov. 22, 2010, 10 pages.

* cited by examiner

METHOD FOR TRAINING DYNAMIC RANDOM ACCESS MEMORY (DRAM) CONTROLLER TIMING DELAYS

CROSS REFERENCE TO RELATED APPLICATIONS

Related subject matter is contained in the following copending applications:

Application Ser. No. 12/059,613, filed Mar. 31, 2008, entitled "CIRCUIT USING A SHARED DELAY LOCKED LOOP (DLL) AND METHOD THEREFOR" invented by Shawn Searles, Nicholas T. Humphries, and Faisal A. Syed and assigned to the assignee hereof.

Application Ser. No. 12/059,593, filed Mar. 31, 2008, entitled "CIRCUIT FOR LOCKING A DELAY LOCKED LOOP (DLL) AND METHOD THEREFOR" invented by Shawn Searles, Nicholas T. Humphries, and Faisal A. Syed and assigned to the assignee hereof.

Application Ser. No. 12/059,641, filed Mar. 31, 2008, entitled "DATA DRIVER CIRCUIT FOR A DYNAMIC RANDOM ACCESS MEMORY (DRAM) CONTROLLER OR THE LIKE AND METHOD THEREFOR" invented by Shawn Searles, Nicholas T. Humphries, and Faisal A. Syed and assigned to the assignee hereof.

Application Ser. No. 12/127,059, filed May 27, 2008, entitled "METHOD AND APPARATUS FOR IMPLEMENTING WRITE LEVELIZATION IN MEMORY SUBSYSTEMS" invented by Shawn Searles et al. and assigned to the assignee hereof.

FIELD OF THE DISCLOSURE

The invention relates generally to dynamic random access memory (DRAM) controllers, and more particularly to training timing delays therein.

BACKGROUND

A data processing system includes a central processing unit (CPU) that executes instructions and thereby manipulates data. The instructions and data are stored in a memory system, which is typically isolated from the CPU. The CPU interacts with the memory system through a memory interface. The functioning of the memory interface is predominantly under the control of the CPU, and is typically performed by a memory controller. The memory controller can be integrated tightly with the CPU, such as on the same silicon chip as the CPU, or it can be included with other components of the data processing system, one such component often referred to as a north-bridge chip.

There are many types of memory. One type is referred to as dynamic random access memory (DRAM). A DRAM system can include several known types of DRAM, of which double data rate (DDR) is an example. The memory controller that governs the interface to the DRAM system may thus be referred to as a DRAM controller. Furthermore, a memory controller that interfaces a CPU to DDR DRAM may be referred to as a DDR DRAM controller.

DDR DRAM conforms to industry standard electrical and protocol standards set forth by the Joint Electron Devices Engineering Councils (JEDEC). These standards define how the contents of the DRAM are accessed (read), and stored (written). The original DDR standard has recently been enhanced to include standards known as DDR2 and DDR3. The interface to any of these DDR DRAMs is accomplished primarily through two signal classes, DQ (data) and DQS (data strobe).

The JEDEC standard interface specifies that during a read operation, the DDR DRAM will issue these two signal classes at the same time, a manner commonly referred to as "edge aligned." In order for the DRAM controller to correctly acquire the data being sent from the DDR DRAM, the DRAM controller typically utilizes a delay-locked loop (DLL) circuit to delay the DQS signal so that it can be used to correctly latch the DQ signals. Topological and electrical difference between DQ and DQS interconnects result in timing skew between these signals, making it difficult to establish a proper delay for the DLL. For similar reasons, the DRAM controller also utilizes DLL circuits to support the writing of data to the DDR DRAM.

The timing delays provided by the DLL circuits can be determined during development of the product wherein these delays are fixed and independent of final product configuration differences. One often refers to such a technique as "dead reckoning." This is suboptimal since the final product and associated components will affect the timing relationships of the memory interface signals. Alternatively, the timing delays provided by the DLL circuits can be customized for each design configuration each time the device is turned on, by executing a training program. The training program is typically a software program stored in a basic input/output system (BIOS) memory device, but it can also be implemented within the device hardware. The training program executes an algorithm, which determines appropriate timing delays associated with each memory interface signal.

Moreover, memory chips now operate at far higher speeds than the speeds of the original DDR DRAMs. These speeds are now so high that signal propagation delays between the DRAM controller and the memory chips can exceed one memory clock (MEMCLK) cycle. At such high speeds, training the timing delays becomes more difficult.

BRIEF SUMMARY

In one form, a receive enable delay in a double data rate (DDR) dynamic random access memory (DRAM) controller is trained. A plurality of data elements is written in a burst cycle to a burst address over a memory interface for storage in a DRAM. A read burst cycle is performed to the burst address over the memory interface using a receive enable delay value to retrieve a plurality of measured data values. One of the plurality of measured data values that is not a first one of the plurality of measured data values is compared to a corresponding one of the plurality of data elements. Whether the receive delay value is a pass receive enable delay value is determined based on the comparison.

In another form, a receive data strobe delay in a double data rate (DDR) dynamic random access memory (DRAM) controller is trained. A plurality of data elements in a burst cycle starting at an initial burst address over a memory interface for storage in a DRAM, wherein alternating ones of the plurality of data elements have different values. For each of a plurality of values of the receive data strobe delay, a read burst cycle is performed starting at the initial burst address over the memory interface using a selected receive enable delay value to retrieve a measured data value, the measured data value is compared to an expected value of a corresponding one of the plurality of data elements to provide a first comparison result, and the measured data value is compared to an expected value of a corresponding next one of the plurality of data elements to provide a second comparison result. A final receive data strobe delay value is determined using the first and second comparison results.

In yet another form, timing delays in a double data rate (DDR) dynamic random access memory (DRAM) controller are trained. A left edge of passing receive enable delay values is determined. A final value of a receive data strobe delay value and a final value of a transmit data delay value are trained. A right edge of passing receive enable delay values is determined using a working value of the receive data strobe delay. A final receive enable delay value is set intermediate between the left edge of passing receive enable delay values and the right edge of passing receive enable delay values.

BRIEF DESCRIPTION OF THE DRAWINGS

The present disclosure may be better understood, and its numerous features and advantages made apparent to those skilled in the art by referencing the accompanying drawing, in which like reference numbers indicate similar or identical items, and in which.

DETAILED DESCRIPTION

Figure 1:
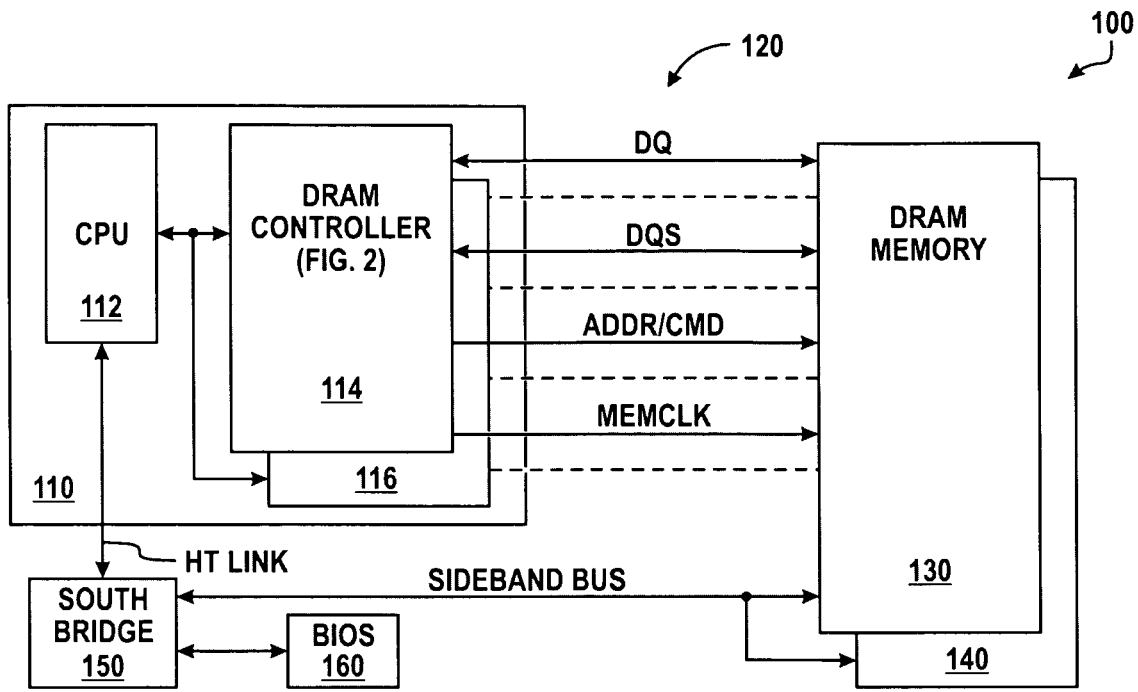
FIG. 1 illustrates in block diagram form a data processing system according to the present invention.

FIG. 1 illustrates in block diagram form a data processing system 100 according to the present invention. Data processing system 100 includes generally a microprocessor 110, a memory interface 120, memories 130 and 140, a south bridge 150, and a basic input/output system (BIOS) memory 160. Microprocessor 110 includes generally a central processing unit (CPU) 112, and dynamic random access memory (DRAM) controllers 114 and 116. CPU 112 has a bidirectional interface to DRAM controllers 114 and 116 for conducting address, data, and control signals, and a terminal connected to an external bidirectional interface labeled "HT LINK." The HT LINK is a high-speed link that conforms to the non-coherent link protocol specification promulgated by the HyperTransport Consortium. DRAM controllers 114 and 116 are also connected to memory interface 120 and each has an input/output terminal for conducting a memory data signal labeled "DQ," an input/output terminal for conducting a memory data strobe signal labeled "DQS," an output terminal for providing address and command information labeled "ADD/CMD," and an output terminal for providing a clock signal labeled "MEMCLK." Memories 130 and 140 are connected to microprocessor 110 via memory interface 120, and each has an input/output terminal for conducting DQ, an input/output terminal for conducting DQS, an input terminal for receiving ADD/CMD, and an input terminal for receiving MEMCLK. Memories 130 and 140 also have terminals for conducting signals via a bidirectional interface labeled "SIDEBAND BUS." South bridge 150 has a first terminal for conducting signals via the bidirectional HT LINK interface for communicating with CPU 112, a second terminal for conducting address, data, and command signals via a bidirectional interface connected to BIOS memory 160, and a third terminal for conducting memory configuration signals via the bidirectional SIDEBAND BUS interface connected to memories 130 and 140.

While the following discussion references only DRAM controller 114 and memory 130, it should be appreciated that DRAM controller 116 and memory 140 are interconnected over memory interface 120 and operate in the same way, and a data processing system can include any number of DRAM controllers and corresponding memories consistent with the principles set forth herein.

Microprocessor 110 is a single-chip data processor that includes CPU 112 as the CPU of system 100. CPU 112 executes stored program instructions and exchanges data with input output devices (not shown in FIG. 1). Note that as shown in FIG. 1, CPU 112 includes other functions such as caches, memory management units, and the like but for ease of discussion these are combined into CPU 112. Memory interface 120 is commonly referred to as the physical or PHY interface.

When CPU 112 performs a write cycle to memory 130, it provides address, control, and data signals to DRAM controller 114. DRAM controller 114 receives the request from CPU 112, and performs a write operation with memory 130 via interface 120. The memory write operation results in the memory location, indicated by the specified address, being updated with the data value supplied by CPU 112. The command portion of signal ADD/CMD informs memory 130 that a write operation is to be performed. Memory data strobe signal DQS identifies to memory 130 when data DQ is ready to be written into the memory.

When CPU 112 performs a read cycle to memory 130, it provides address and control signals to DRAM controller 114. DRAM controller 114 receives the request from CPU 112, and performs a read operation with memory 130 via interface 120. The command portion of signal ADD/CMD informs memory 130 that a read operation is to be performed. The read operation accesses memory 130 at the specified address and memory 130 responds by providing DRAM controller 114 with the requested data DQ and also provides memory data strobe signal DQS which informs DRAM controller 114 that the requested data is available. After completing the read operation, DRAM controller 114 provides the requested data to CPU 112.

CPU 112 can also receive instructions and data from BIOS memory 160 via south bridge 150. These instructions typically facilitate initialization of data processing system 100, and can include instructions that implement time delay training algorithms that help establish communication protocols between DRAM controller 114 and memory 130.

Memory 130 is implemented with double data rate (DDR) memory. Specifically, DRAM controller 114 supports either DDR2 or DDR3 memory. In other embodiments, DRAM controller 114 may easily be modified to support other versions of the DDR standard and other forms of DRAM. Moreover, DRAM controller 114 may also be modified to support other types of memory such as DDR static random access memory (SRAM), DDR flash memory, and the like.

According to the DDR standard, read and write transactions are performed in bursts, in which the address provided by signal ADD/CMD represents the first location of a series of sequential locations that will be read or that will be written to. Memory data strobe information conveyed by signal DQS is represented as a differential voltage waveform on two conductors. The command portion of signal ADD/CMD is used to request that a read or write transaction is to be performed, but is also used to initiate other types of operations including reset, refresh, and others, as described in the DDR standard.

Since memory 130 is a DDR memory, it transmits memory data strobe signal DQS during a read cycle nominally aligned with transitions of data signal DQ. During a write cycle, DRAM controller 114 transmits memory data strobe signal DQS nominally centered on the transitions of data signal DQ. Despite these requirements on the timing of DQS relative to DQ, the physical distance between memory 130 and microprocessor 110 and the relatively high speed of operation cause DQS to arrive at an arbitrary phase with respect to DQ. The use of DQS in this manner creates the need to individually delay the outgoing DQ and DQS signals during a write operation, and to delay the incoming DQS signals during a read operation. If DDR memory 130 uses memory chips organized as by-four ("x4") memories, then memory 130 requires the provision of two differential DQS signal pairs for each byte of data, because both DQS signal pairs must be individually delayed to match the characteristics of their respective chips. DRAM controller 114 also must generate a receive enable signal to synchronize the start of a read operation to avoid spuriously latching data before it is available. Generation of such a receive enable signal also requires its own delay circuit.

The time delay required by each of the delay circuits must be individually determined. DRAM controller 114 performs a calibration procedure after power is initially supplied to data processing system 100 and reset is performed. DRAM controller 114 performs this calibration under the control of BIOS 160 prior to CPU 112 executing any application programs, to determine the appropriate delay values. DRAM controller 114 stores the individual delay values in registers, and these values in turn control the time delay provided by their corresponding delay circuits.

Forming all these delays requires a substantial amount of circuit area. DRAM controller 114 requires a total of five delays in order to support reading and writing each byte of data, two for the write path and three for the read path. Moreover, DRAM controller 114 supports a 64-bit wide bus with an additional eight bits of error correcting code (ECC). Thus DRAM controller 114 requires a total of forty-five separate delays. DRAM controller 116 requires the same number of delays, and this same number of delays would be required for each additional DRAM controller used.

Moreover DRAM controller 114 utilizes delay locked loop (DLL) circuits to provide these appropriate delays. Unfortunately, a DLL circuit is a very expensive component of a DRAM controller. The DLL circuit is physically large, increasing cost both due to the area of silicon involved, and due to lower manufacturing yield. Each DLL circuit also consumes significant electrical power, which ultimately limits system performance and increases operating cost. Especially because DRAM controller 114 requires five delays for each byte of data, the physical layout topology of a set of five DLL circuits is inefficient, resulting in even higher silicon area costs.

Figure 2:
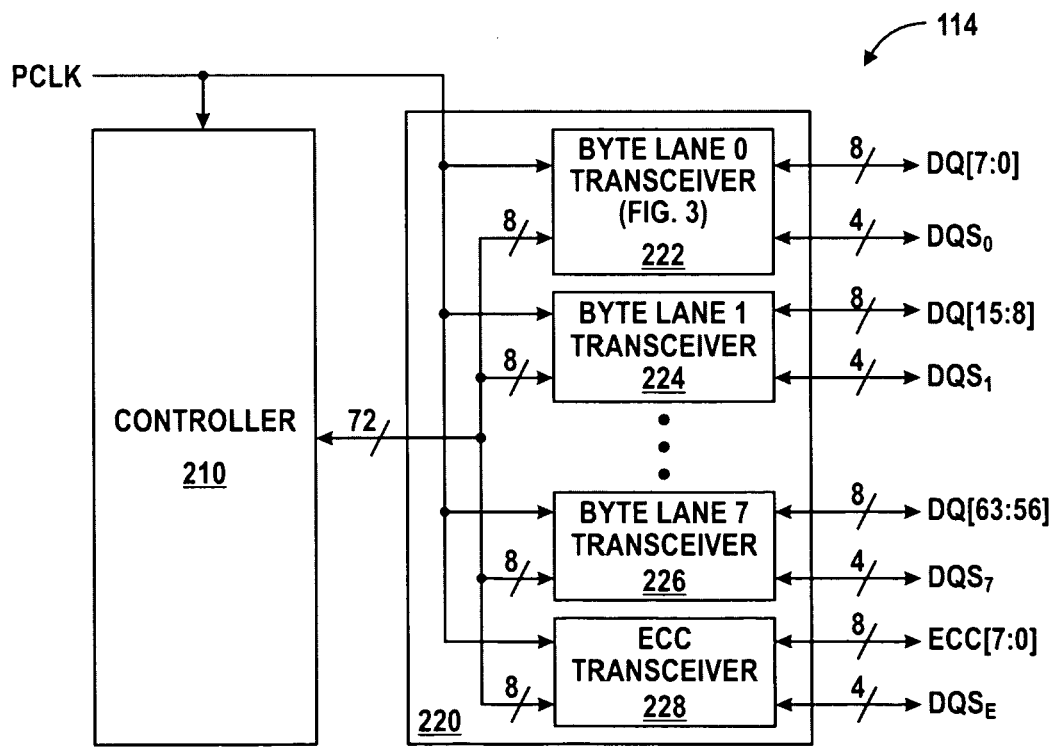
FIG. 2 illustrates in block diagram form the DRAM controller of FIG. 1.
Figure 3:
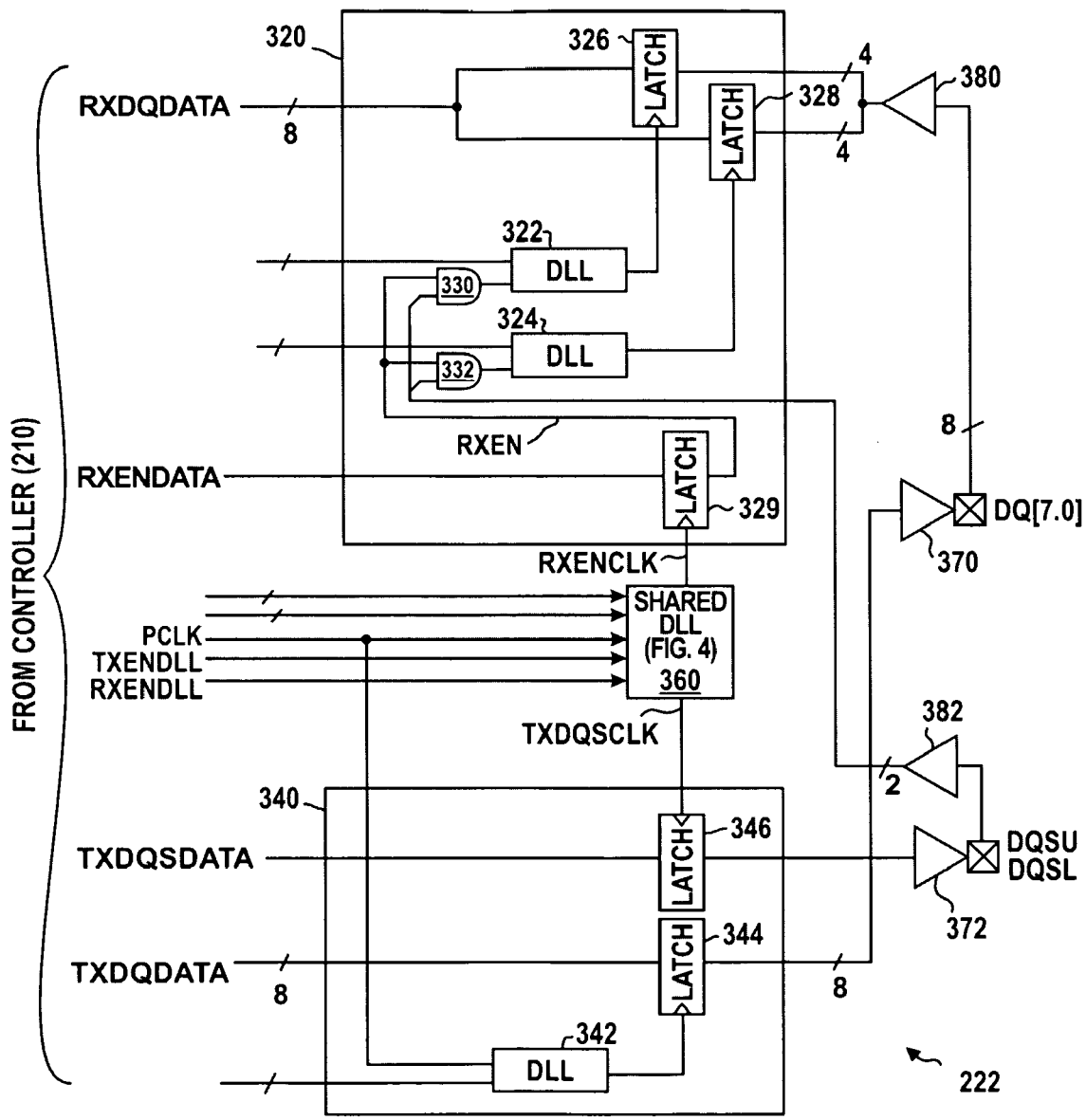
FIG. 3 illustrates in partial block diagram and partial logic diagram form a byte lane transceiver of the DRAM controller of FIG. 2.
Figure 4:
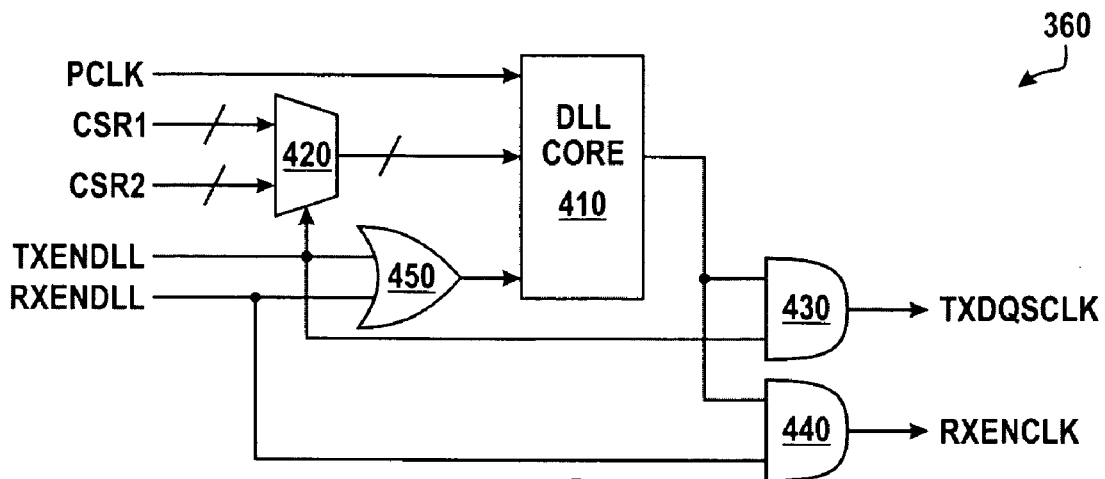
FIG. 4 illustrates in partial block diagram and partial logic diagram form the shared DLL of FIG. 3.

However DRAM controller 114 uses a shared DLL for both the read path and the write path. Thus DRAM controller 114 is more efficient in terms of circuit area than known DRAM controllers. DRAM controller 114 dynamically updates the delay value provided to the shared DLL depending on whether it is currently performing a function in the read path or the write path. FIGS. 2-4 below further illustrate additional details of the structure of DRAM controller 114 and the use and advantages of the shared DLL.

FIG. 2 illustrates in block diagram form DRAM controller 114 of FIG. 1. DRAM controller 114 generally includes a controller 210 and a transceiver 220. Controller 210 has an input for receiving a processor clock signal labeled "PCLK," a first bidirectional connection to CPU 112 (not shown in FIG. 2), and a second bidirectional connection that conducts control and data signals, including sixty-four bits of data and eight ECC bits for a total of seventy-two bits. Additional details relating to the interface between controller 210 and CPU 112 are not shown in FIG. 2.

Transceiver 220 includes eight byte-lane transceivers including representative byte-lane transceivers 222, 224, and 226, and one ECC transceiver 228. Each transceiver provides and receives eight bits of processor data through controller 210, and receives signal PCLK, and configuration data and operation commands from controller 210 (not shown in FIG. 2). Each transceiver is connected to memory interface 120 of FIG. 1 for conducting corresponding memory data and memory data strobe signals. Byte-lane transceiver 222 includes bidirectional terminals to conduct a set of memory data signals labeled "DQ[7:0]" and a set of memory data strobe signals labeled "$DQS_0$." Byte-lane transceiver 224 includes bidirectional terminals to conduct a set of memory data signals labeled "DQ[15:8]" and a set of memory data strobe signals labeled "$DQS_1$." Byte-lane transceiver 226 includes bidirectional terminals to conduct a set of memory data signals labeled "DQ[63:57]" and a set of memory data strobe signals labeled "$DQS_7$." ECC transceiver 228 includes bidirectional terminals to conduct a set of memory data signals labeled "ECC[7:0]" and a set of memory data strobe signals labeled "$DQS_E$." Each of signals $DQS_{(x)}$ are implemented as two signals: an upper-nibble signal labeled "$DQSU_{(x)}$" and a lower-nibble signal labeled "$DQSL_{(x)}$." Note that DRAM controller 114 uses signal $DQSU_{(x)}$ as an upper data strobe signal if x4 DDR memory is selected, but as a data mask signal if x8 or x16 memory is selected. These signals are used within each byte-lane transceiver as single-ended signals. However during a memory write operation, these single ended signals are converted into differential signal pairs and provided to memory interface 120, and during a memory read operation, these signals are received at memory interface 120 as differential signal pairs and are converted into single-ended signals by a differential amplifier (not shown).

FIG. 3 illustrates in partial block diagram and partial logic diagram form byte-lane transceiver circuit 222 of DRAM controller 114 of FIG. 2. Byte-lane transceiver 222 includes a read path circuit 320, a write path circuit 340, a shared DLL 360, line drivers 370 and 372, and line receivers 380 and 382.

Read path circuit 320 includes an upper-nibble DLL 322, a lower-nibble DLL 324, AND gates 330 and 332, and latches 326, 328 and 329. Latch 329 has a data input for receiving a signal labeled "RXENDATA" from controller 210, a clock input for receiving a signal labeled "RXENCLK" from shared DLL 360, and an output labeled "RXEN." AND gate 330 has a first input, a second input for receiving signal RXEN, and an output. AND gate 332 has a first input, a second input for receiving signal RXEN, and an output. DLL 322 has a clock input connected to the output of AND gate 330, a second input for receiving a delay selection value from controller 210, and an output for providing a time delayed version of the upper-nibble memory data strobe signal DQSU. DLL 324 has a clock input connected to the output of AND gate 332, a second input for receiving a delay selection value from controller 210, and an output for providing a time delayed version of the lower-nibble memory data strobe signal DQSL. Latch 326 has a data input, a clock input connected to the output of DLL 322, and an output for providing four bits of an 8-bit data signal labeled "RXDQDATA" to controller 210. Latch 328 has a data input, a clock input connected to the output of DLL 324, and an output for providing the other four bits of RXDQDATA to controller 210. Latches 326 and 328 are dual-edge latches wherein input data is latched on the rising edge as well as on the falling edge of the clock signals provided by DLL 322 and 324, respectively. A multiplexer incorporated in each of latches 326 and 328 provides the appropriate latched data to the latch output terminal based upon the logic level of the input clock.

Write path circuit 340 includes a DLL 342, and latches 344 and 346. DLL 342 has a first input for receiving signal PCLK, a second input for receiving a delay selection value from controller 210, and an output. Latch 344 has a data input for receiving a signal labeled "TXDQDATA," a clock input connected to the output of DLL 342, and an output. Latch 346 has a data input for receiving a signal labeled "TXDQSDATA" from controller 210, a clock input for receiving a signal labeled "TXDQSCLK" from shared DLL 360, and an output.

Shared DLL 360 is shared and utilized by read path circuit 320 during read cycles and also by write path circuit 340 during write cycles. Shared DLL 360 has a first input for receiving a first delay selection value, a second input for receiving a second delay selection value, a third input for receiving signal PCLK, fourth and fifth inputs for respectively receiving signals labeled "TXENDLL" and "RXENDLL" from controller 210, a first output for providing signal RXENCLK, and a second output for providing signal TXDQSCLK.

Line driver 370 has an input connected to the output of latch 344 and an output for providing signal DQ[7:0] to memory interface 120. Line driver 372 has an input connected to the output of latch 346 and an output for providing the upper-nibble memory data strobe signal DQSU and the lower-nibble memory data strobe signal DQSL to memory interface 120. Line receiver 380 has an input for receiving the upper-nibble of DQ[7:0] (i.e. DQ[7:4]), and the lower-nibble of DQ[7:0] (i.e. DQ[3:0]) from memory interface 120 and an output connected to the data inputs of latches 326 and 328. Line receiver 382 has an input for receiving the differential versions of the upper-nibble memory data strobe signal DQSU and lower-nibble memory data strobe signal DQSL from memory interface 120, and an output connected to the first input of AND gate 330 for providing a single-ended upper-nibble memory data strobe and to the first input of AND gate 332 for providing a single-ended lower-nibble memory data strobe.

During a read operation, DLLs 322 and 324 delay memory data strobe signals DQSU and DQSL, respectively to capture the incoming data with adequate setup and hold time for the proper operation of latches 326 and 328. Having been successfully captured, the latched data is made available to controller 210 as RXDQDATA. During the read operation, controller 210 enables shared DLL 360 by activating signal RXENDLL while keeping signal TXENDLL inactive, and shared DLL 360 subsequently activates signal RXENCLK after a delay determined by the value received on the first input. As previously described, transceiver 222 receives differential signal versions of memory data strobe signals DQSU and DQSL, but converts them into single-ended signals for use by the byte-lane transceiver. Byte-lane transceiver 222 at FIG. 3 supports x4 DDR memories. Read path circuit 320 would only require one of DLLs 322 and 324 to support x8 DDR memories.

During the read operation, transceiver 222 uses DLLs 322 and 324 to appropriately delay the incoming memory data strobe signals DQSU and DQSL to capture the incoming data DQ[7:0] at the appropriate point in time. To understand why the appropriate timing is difficult to achieve, note DRAM memory 130 conforms to DDR standards that specify that the DDR memory transmit the requested data with the data transitions aligned with the transitioning of the memory data strobe signal that it also is transmitting. The memory interface operates at a data rate that can exceed 800 MHZ. This high speed causes relatively poor signal integrity of the incoming data signals, requiring latches 326 and 328 to capture them at an appropriate point in time, somewhere near the center of the incoming data transition interval. The small portion of time that all four bits of incoming data are valid and can be captured is usually referred to as the data "eye." The width of the eye represents the period of time that the data is valid and the height of the eye represents the voltage range of the valid data. Signal integrity degradation limits the width and the height of the eye.

Moreover, DDR memory may be placed on computer motherboards in any one of multiple dual inline memory module (DIMM) slots. If microprocessor 110 attempts to access a DRAM in the closest memory slot, the physical distance will cause the delay to be shorter than if microprocessor 110 attempts to access a DRAM in the farthest memory slot. In addition, different memory chips introduce variable amounts of skew between memory data signal DQ and memory data strobe signal DQS. Data processing system 100 accommodates the different skews and different distribution characteristics by training different values for the delay select signal according to which memory slot is accessed. Thus controller 210 provides the delay select values that are appropriate and are used by DLLs 322 and 324, which generate clocks for latches 326 and 328 that are centered on the eye for each DRAM.

During a write operation, write path circuit 340 and shared DLL 360 provide a suitably time-delayed version of the processor data signal DQ[7:0] and corresponding memory data strobe signals DQSU and DQSL to memory interface 120. During the write operation, controller 210 enables shared DLL 360 by activating signal TXENDLL while keeping signal RXENDLL inactive, and shared DLL 360 subsequently activates signal TXENCLK after a delay determined by the value received on its second input. Signal TXDQSCLK determines the timing of memory data strobe signals DQSU and DQSL. As previously described, transceiver 222 converts single ended signals DQSU and DQSL into differential signal pairs before being provided to interface 120.

During the write operation, byte-lane transceiver 222 provides data signal DQ[7:0] and memory data strobe signals DQSU and DQSL with a timing relationship established by DLL 342 and shared DLL 360. Controller 210 sets an appropriate timing relationship between the transmitted data and memory data strobe signals so that the memory data strobe signal transition occurs centered on the interval between data signal transitions. This timing relationship is determined through a calibration procedure performed by the BIOS after power is initially supplied to the system and reset is performed.

The DDR standard requires read and write operations to be separated by a delay equal to the period of only two DQS cycles. Shared DLL 360 transitions between support of read path circuit 320 and support of write path circuit 340 within this time period. Shared DLL 360 switches to providing the alternate one of outputs TXDQSCLK and RXENCLK. The architecture of shared DLL 360 allows rapid switching between modes so that the transition occurs within about a single DQS cycle, and this architecture will be described further with respect to FIG. 4 below.

Shared DLL 360 thus performs the functions of two individual DLLs, reducing system costs and increasing system performance. Note that in DRAM controller 114, each byte lane transceiver has a structure substantially the same as transceiver 222, and thus DRAM controller 114 uses nine fewer DLLs than what is needed to replicate the total number of unique delays. DRAM controller 116 uses shared DLLs in each byte lane transceiver in a similar fashion. Needing only four DLLs instead of five per byte lane also allows the transceivers to be laid out in a more symmetrical fashion.

FIG. 4 illustrates in partial block diagram and partial logic diagram form shared DLL 360 of FIG. 3. Shared DLL 360 includes DLL core 410, multiplexer 420, AND gates 430 and 440, and OR gate 450. DLL core 410 has a clock input for receiving signal PCLK, a delay select input, a power up control input, and an output. Multiplexer 420 has a first input for receiving a read-enable delay selection value signal labeled "CSR1," a second input for receiving a transmit DQS delay selection value signal labeled "CSR2," a third input for receiving a select signal labeled "TXENDLL," and an output connected to the second input of DLL core 410. OR gate 450 has a first input for receiving signal TXENDLL, a second input for receiving signal RXENDLL, and an output connected to the power up control input of DLL core 410. AND gate 430 has a first input connected to the output of DLL core 410, a second input for receiving signal TXENDLL, and an output for providing signal TXDQSCLK. AND gate 440 has a first input connected to the output of DLL core 410, a second input for receiving signal RXENDLL, and an output for providing signal RXENCLK.

During a read operation, signal RXENDLL is active and signal TXENDLL is inactive. Signal RXENDLL configures multiplexer 420 to provide read-enable delay selection value signal CSR1 to DLL core 410. Signal CSR1 represents a time delay value stored in a register within controller 210 and configures DLL core 410 to enable signal RXENCLK to enable latches 326 and 328 of read patch circuit 320 at the appropriate time.

During a write operation, signal TXENDLL is active and signal RXENDLL is inactive. Signal TXENDLL configures multiplexer 420 to provide transmit DQS delay selection value signal CSR2 to DLL core 410. Signal CSR2 represents a time delay value stored in a register within controller 210 and configures DLL core 410 to enable signal TXDQSCLK to enable latch 346 of write path circuit 340 at the appropriate time.

As previously described, shared DLL 360 responds to signals TXENDLL and RXENDLL, and switches from providing a delay specified by either one of signals CSR1 and CSR2 during a period of about one DQS cycle.

It should be appreciated that DLL core 410 may be implemented using any of a variety of known DLL architectures. For example, DLL core 410 can be implemented as a DLL that uses $2^N$ sequential delay stages and an N-bit delay selection signal. DLL core 410 can also be implemented as a multiplying DLL or as a recirculating DLL.

Wherein transceiver 222 shares a single DLL by both the write-path circuitry and the read-path circuitry, it should be appreciated that a second DLL can also be shared by the read path and write path circuitry. For example, whereas shared DLL 360 shares the write DQS and receive enable delay functions, the second shared DLL could share the read DQS and write DQ delay functions. By extending the sharing to two DLLs, a byte-lane transceiver supporting x4 DDR memories only requires three DLLs instead of five, and a byte-lane transceiver supporting x8 or x16 DDR memories (in which eight bits of data are locked to a single DQS) only requires two DLLs instead of four.

Moreover, while FIGS. 1-4 have illustrated the use of a shared DLL in the context of a DRAM controller, such a transceiver may be advantageous in other types of circuits. For example, a transceiver with a shared DLL could be used in the DRAM itself. Since future generations of DRAMs may require increasingly sophisticated signaling techniques but will likely remain cost-sensitive, using a transceiver with a shared DLL would be especially advantageous. Other uses of the transceiver will also be readily apparent to those of ordinary skill in the art.

Before performing high speed read or write transactions with memory 130, the timing relationships between the signals of interface 120 and specific internal signals associated with transceiver 220, must be adjusted. This adjustment involves performing a calibration algorithm implemented in hardware, software, or in both hardware and software. The calibration algorithm determines appropriate coarse delays, which are multiples of a PCLK cycle, as well as fine delays provided by each DLL circuit. The fine delay provided by a DLL is a fraction of one PCLK cycle. In the illustrated embodiment, the delay resolution provided by a DLL is $\frac{1}{32}^{nd}$ of one PCLK cycle, but other fractional resolutions can be utilized. One may refer to the act of determining these delays as "training" the delay. In this embodiment, the calibration algorithm is realized by a program residing in BIOS memory 160 of data processing system 100. CPU 112 executes the program during system initialization. The calibration algorithm can be divided into major steps, each pertaining to the training, or a portion of the training, of a specific signal delay.

Figure 5:
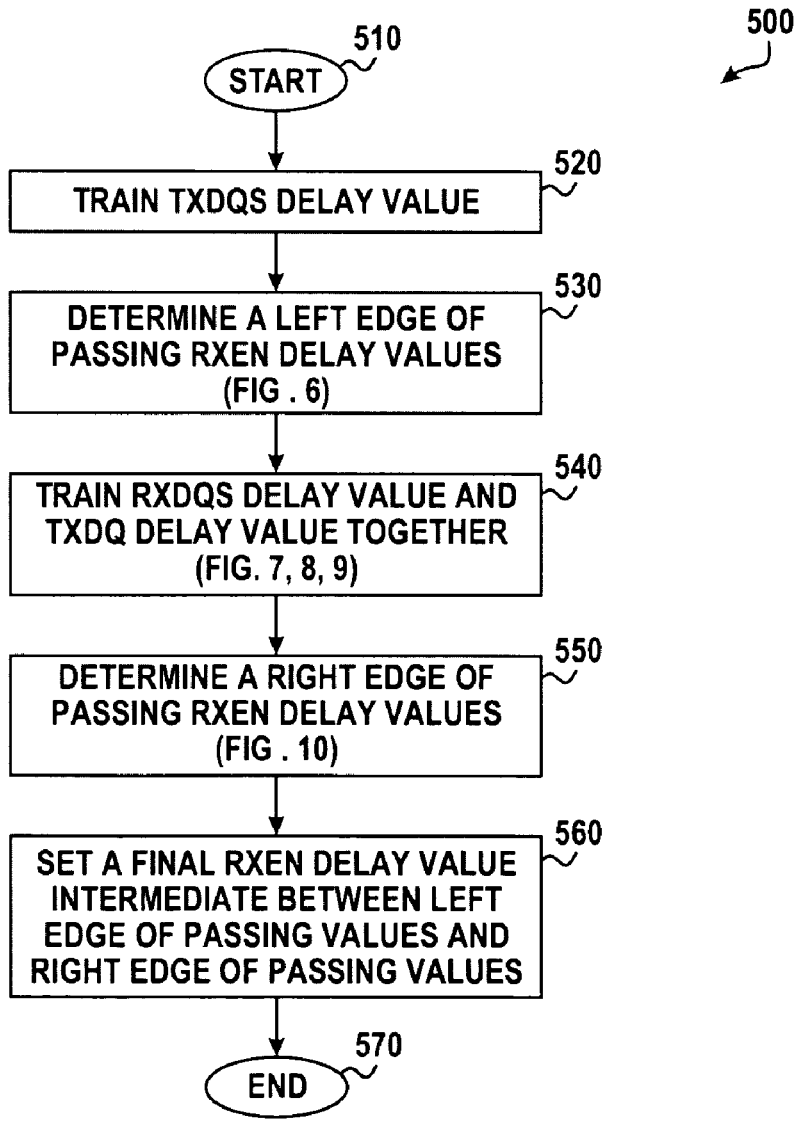
FIG. 5 illustrates a flow diagram of a method for training timing delays using the basic input/output system (BIOS) of FIG. 1.

FIG. 5 is a flow diagram that illustrates an overview of major steps 500 making up the calibration algorithm. The flow starts at step 510 and proceeds to step 520 wherein the transmit data strobe (TXDQS) delay value is trained. TXDQS training can also be referred to as "write levelization." The flow proceeds to step 530 wherein a left edge of passing values of receive enable (RXEN) delay values is determined. This algorithm is further illustrated in the flow diagram at FIG. 6. The flow proceeds to step 540 wherein the receive data strobe (RXDQS) delay value is trained together with the transmit data (TXDQ) delay value. This algorithm is further illustrated in the graphs at FIG. 7 and FIG. 8, and in the flow diagram at FIG. 9. The flow proceeds to step 550 wherein the right edge of passing RXEN delay values is determined. This algorithm is further illustrated in the flow diagram at FIG. 10. The flow proceeds to step 560 wherein an operating RXEN delay value intermediate between the left edge of passing RXEN delay values and the right edge of passing RXEN delay values is set, and the flow ends at step 570.

Figure 6:
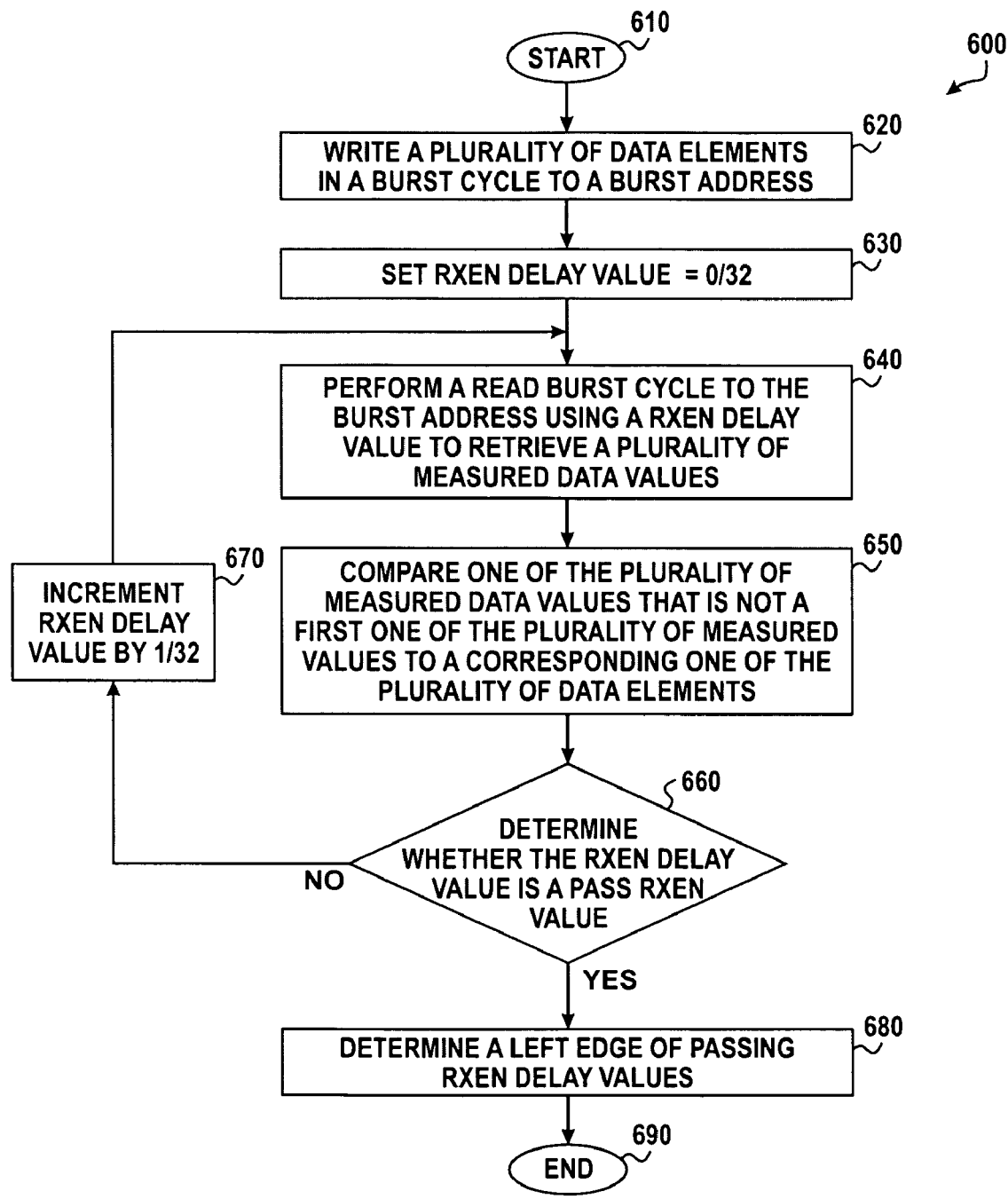
FIG. 6 illustrates a flow diagram with details of a first portion of the method of FIG. 5.

FIG. 6 is a flow diagram that illustrates an algorithm 600 to determine a left edge of passing RXEN delay values at step 530 of FIG. 5. The flow starts at step 610 and proceeds to block 620 wherein a plurality of data elements is written in a burst cycle to a burst address. The flow proceeds to step 630 wherein the RXEN delay is set to an initial value of $\frac{0}{32}$. The flow proceeds to step 640 wherein a read burst cycle is performed to the burst address of step 620 using the current RXEN delay value to retrieve a plurality of measured data values. The flow proceeds to step 650 wherein one of the plurality of measured data values that is not a first of the plurality of measured values is compared to a corresponding one of the plurality of data elements. The flow proceeds to decision step 660 wherein it is determined whether the RXEN delay value is a pass value. If the RXEN delay value is a pass value then the flow proceeds to block 680 wherein a left edge of passing RXEN delay values is determined, and the flow ends at step 690. If the RXEN delay value is not a pass value, then the flow proceeds to step 670, wherein the RXEN delay value is incremented by a value of $\frac{1}{32}$ and then proceeds back to step 640.

More particularly, algorithm 600 of FIG. 6 begins at step 620 wherein a burst of 4 data elements are written to memory 130 at a burst address. One can refer to the writing of a data element as a "beat" of the burst cycle. All bit values in each beat of the burst are either a "one" or all bit values are a "zero." By having all 4 bit values constant, one creates an enlarged data eye opening wherein one can guarantee that the $2^{nd}$ and $3^{rd}$ bit values are written correctly. The first and last bit values may not be correctly written because the TXDQ delay value is not yet trained to a final value. If the write burst consisted of four zeros (0000), then the corresponding elements of memory 130 will contain the values "X00X," the "X" values signifying that one can not be assured that these elements were successfully modified during the write operation. If the write burst consisted of four ones (1111), then the corresponding elements of memory 130 will contain the values "X11X." Alternatively, 8 bits can be written. If a value of "11110000" is written, then the corresponding elements of memory 130 will contain the value "X11XX00X." If a value of "00001111" is written, then the corresponding elements of memory 130 will contain the value "X00XX11X." The robustness of the algorithm is increased if a TXDQ delay value of $\frac{16}{32}$ is utilized during the write operation to provide symmetric setup and hold times to the second and third bit times. All eight DQ signal lines of a byte lane can be trained in parallel with the same data values.

Following the writing step 620, algorithm 600 continues by performing a read burst cycle using the burst address of step 620. The read burst operation is repeated a total of thirty-two times using all values of RXEN delay between $\frac{0}{32}$ and $\frac{31}{32}$, inclusive. For each read burst cycle, the data value that is retrieved is compared to the data value that was previously written to the corresponding data elements of memory 130. For each read burst cycle, a RXDQS delay value of either $\frac{0}{32}$ or $\frac{31}{32}$ can be utilized. If the original value written to memory 130 is "0000," then a "passing" read value is "XX0X" if the RXDQS delay value is $\frac{0}{32}$, and "X0XX" if the RXDQS delay value is $\frac{31}{32}$. If any other value is read, then the value is a "failing" read value. If the original value written to memory 130 is "1111," then a "passing" read value is "XX1X" if the RXDQS delay value is $\frac{0}{32}$, and "X1XX" if the RXDQS delay value is $\frac{31}{32}$. If the original value written to memory 130 is "11110000," then a "passing" read value is "XX1XXX0X" if RXDQS is $\frac{0}{32}$, and "X1XXX0XX" if the RXDQS delay value is $\frac{31}{32}$. If the original value written to memory 130 is "00001111," then a "passing" read value is "XX0XXX1X" if the RXDQS delay value is $\frac{0}{32}$, and "X0XXX1XX" if the RXDQS delay value is $\frac{31}{32}$.

For each value of RXEN delay, it is determined whether the corresponding compare step is classified as a pass or a fail. The smallest RXEN delay value that is classified as a pass can be referred to as the "left edge of passing RXEN delay values," and corresponds to the left edge of the preamble of the read DQS signal supplied by memory 130. Before proceeding to determine the right edge of passing RXEN delay values, RXDQS and TXDQ training is performed whereby final delay values for RXDQS and TXDQ are determined.

Figure 7:
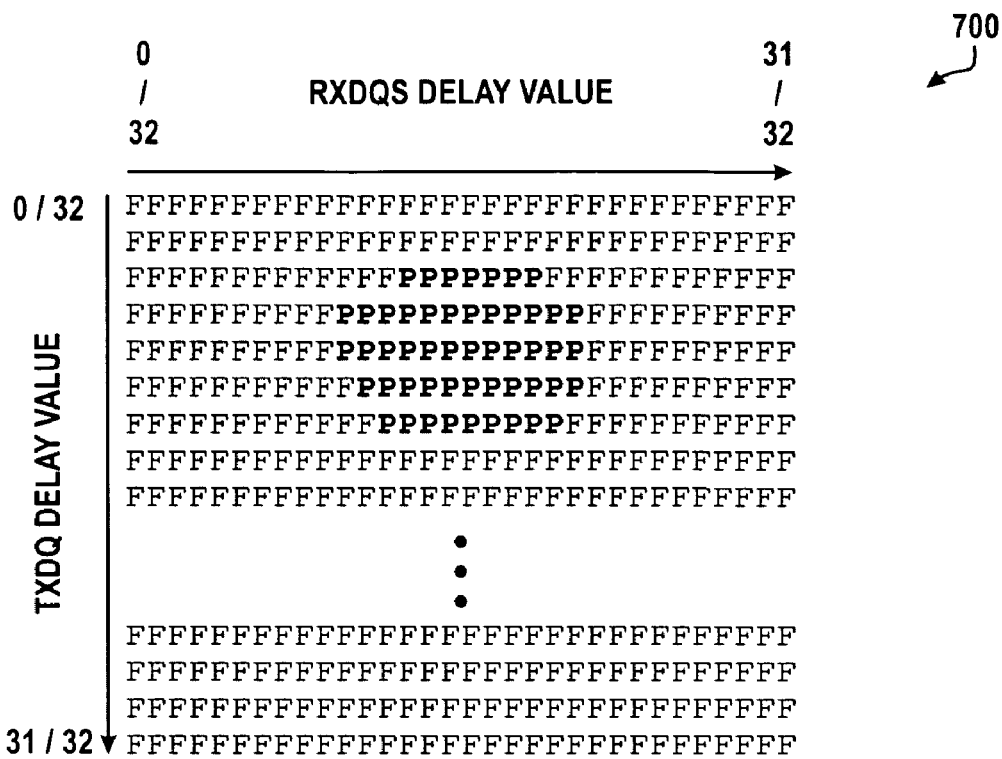
FIG. 7 illustrates in graph form details of a second portion of the method of FIG. 5.
Figure 8:
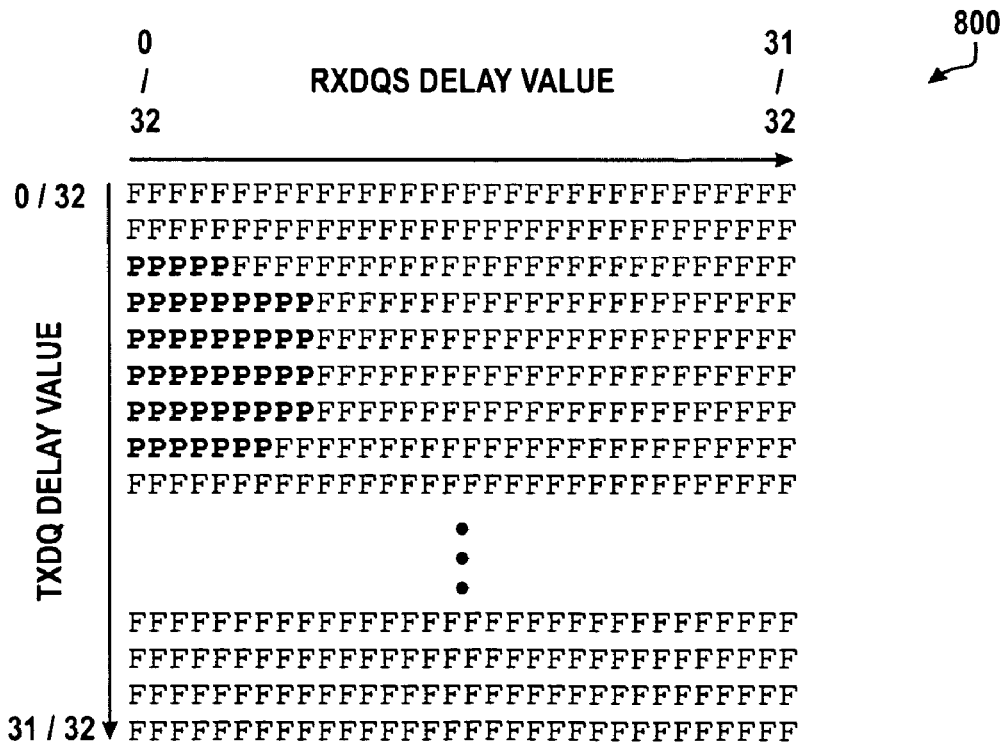
FIG. 8 illustrates in graph form further details of the second portion of the method of FIG. 5.

FIG. 7 illustrates a graph 700 representing an array of 1024 write and read operations performed to memory 130, each operation completed using a unique value of RXDQS delay and TXDQ delay. The horizontal dimension represents RXDQS delay values expressed as fractions of a unit interval (PCLK cycle), increasing from $\frac{0}{32}$ on the left, to $\frac{31}{32}$ on the right. The vertical dimension represents TXDQ delay values expressed as fractions of a unit interval, increasing from $\frac{0}{32}$ at the top, to $\frac{31}{32}$ at the bottom. For each combination of RXDQS and TXDQ delay values, a write and read operation can be performed and the operation is classified as a "pass" or a "fail" based on whether the data value that is retrieved during the read operation matches the data value that was written during the write operation. Graph 700 depicts the result of each write and read operation with a "P" if the operation is classified as a pass and an "F" if the operation is classified as a fail. Typically, training begins with a TXDQ delay value of $\frac{0}{32}$, and a 72-bit data value is written to memory 130 in a plurality of beats of a burst cycles, starting at an initial burst address. This write cycle is followed by performing thirty-two read operations, each attempting to retrieve the 72 bits that were previously written, and each using a unique RXDQS delay value, starting at $\frac{0}{32}$ and ending with $\frac{31}{32}$. Each read operation is classified as a pass or a fail. The TXDQ delay value is then incremented by $\frac{1}{32}$ and the write operation and thirty-two read operations are repeated in the same manner just described. This process continues until all TXDQ and RXDQS delay values have been tested.

The preceding training algorithm can be expedited in the following way: Having identified a row of passing RXDQS delay values that includes at least a minimum number of passing RXDQS delay values, a final RXDQS delay value is determined by selecting a delay value intermediate and approximately half way between the left passing value and the right passing value. This final RXDQS delay value is used while testing subsequent TXDQ delay values. Training can end when a new TXDQ delay value results in a fail. Selecting a TXDQ delay value intermediate and approximately half way between the smallest passing TXDQ delay value and the largest passing TXDQ delay value can determine a final TXDQ delay value.

The ultimate goal of the RXDQS and TXDQ training algorithm is to determine a final RXDQS delay value and TXDQ delay value that provides preferential margin and data integrity ensuring successful memory write and read transactions. In one embodiment, the selected delay value can be approximately midway in the range of passing values. The data value that is written to memory 130 can be 72 bits in length and can be selected to approximately minimize signal quality caused by maximizing inter-symbol interference. Different 72-bit data values can be written to each DQ signal line, thus maximizing crosstalk interference, further minimizing signal quality.

All components making up transceiver 220 introduce unwanted delays. One can refer to the unwanted delay introduced by RXDQS DLLs 322 and 324 as "insertion delay." As the speeds at which DDR memories can operate continues to increase, these insertion delays become a proportionally increasing fraction of a PCLK cycle time. A result of RXDQS DLL insertion delay is illustrated in graph 800 at FIG. 8 wherein the range of passing RXDQS delay values has shifted to the left. If the range of passing RXDQS delays shifts far enough to the left such that a RXDQS delay value of $\frac{0}{32}$ results in a pass, selecting a delay midway in the range of passing values may no longer provide the preferred delay value. Due to insertion delay present in the RXDQS circuitry, there can be passing RXDQS delay values that effectively correspond to negative RXDQS delay values.

Figure 9:
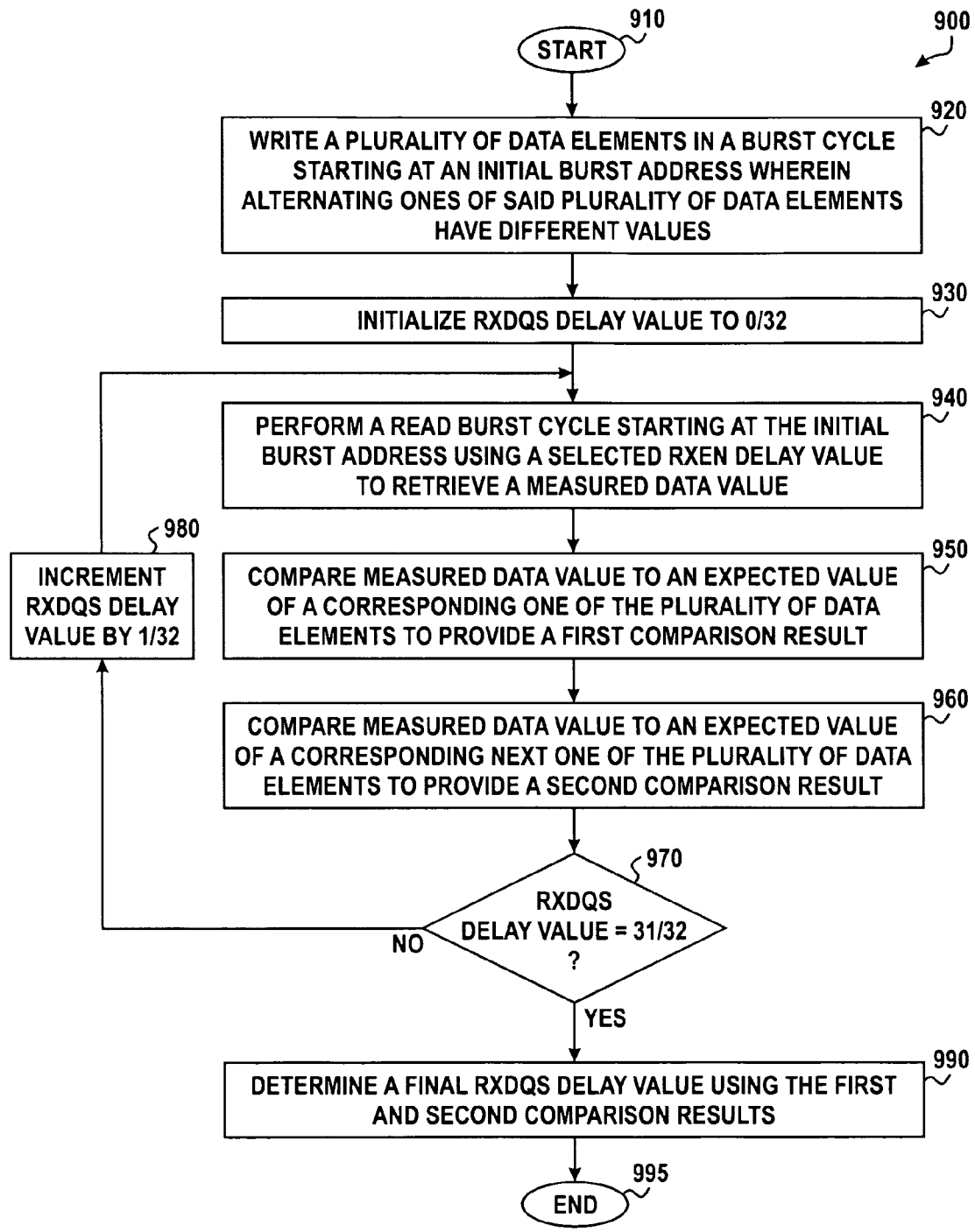
FIG. 9 illustrates a flow diagram with yet further details of the second portion of the method of FIG. 5.

FIG. 9 is a flow diagram that illustrates algorithm 900 that can be used to identify a preferred final RXDQS delay value when insertion delay would seemingly prevent finding the left edge of passing RXDQS delay values. The flow starts at step 910 and proceeds to 920 wherein a plurality of data elements are written in a burst cycle starting at an initial burst address and wherein alternating ones of said plurality of data elements have a different value. The flow proceeds to step 930 wherein the RXDQS delay value is initialized to 0/32. The flow proceeds to step 940 wherein a read burst cycle is performed starting at the initial burst address of step 920 using a selected RXEN delay value, to retrieve a measured data value. The flow proceeds to step 950 wherein the measured data value of step 940 is compared to an expected value of a corresponding one of the plurality of data elements to provide a first comparison result. The flow proceeds to step 960 wherein the measured data value of step 940 is compared to an expected value of a corresponding next one of the plurality of data elements to provide a second comparison result. The flow proceeds to decision step 970 wherein the current value of RXDQS delay is evaluated. If the current RXDQS delay value is not equal to 31/32, the flow proceeds to step 980 wherein The RXDQS delay value is incremented by 1/32. If the current RXDQS delay value is equal to 31/32, then the flow proceeds to step 990 wherein the final RXDQS delay value is determined using the first and second comparison results. The flow ends at step 995.

During the execution of algorithm 900, a RXEN delay value is selected which is 16/32 greater than the left-edge of passing delay values determined in step 680 of algorithm 600. A 72 bit data value is written to data memory 130 starting at an initial burst address. This value can be referred to as the "expected" value and can be represented as "E[71:0]." The 72 bit data value is then retrieved by performing a read operation starting at the same initial burst address. This retrieved value can be referred to as the "measured" value and can be represented as "M[71:0]." The read operation is repeated a total of thirty-two times using all values of RXDQS delay between 0/32 and 31/32, inclusive. For each value of RXDQS delay, the measured value M[n] is compared to the corresponding expected value E[n] and each comparison is classified as a pass (P) if the measured value is the same as the expected value, and classified as a fail (F) if the measured value is not the same as the expected value. The thirty-two comparison results can be represented by the following mapping:

PPPPPPPPPPPPPPFFFFFFFFFFFFFFFFFF

The compare corresponding to a RXDQS delay value of 0/32 is on the left and the compare corresponding to a RXDQS delay value of 31/32 is on the right. This first mapping can be referred to as the first comparison result. A second mapping and second comparison result is now obtained by comparing, for each value of RXDQS delay, the measured value M[70:0] to the expected value E[71:1]:

FFFFFFFFFFFFFFFFFFFFFFFFFFFFFPPP

The two comparison results are now merged by concatenating the first comparison result mapping onto the end of the second comparison result mapping. The resulting final mapping would look like the following:

FFFFFFFFFFFFFFFFFFFFFFFFFFFFFPPPPPPPPPPPPPPPPPPFFFFFFFFFFFFFFFFFF

The 64 results are numbered from −32 on the left, incrementing by one for each result towards the right, with the right most result corresponding to number +31. Each result now has a specific "location" represented by its corresponding number. The preferred final RXDQS delay value can now be determined by mathematically averaging the location of the left most passing value and the right most passing value, thus identifying the RXDQS delay value corresponding to substantially the middle of the passing region of the final mapping. For example, if the left most passing RXDQS delay value corresponds to location number "−3," and the right most passing RXDQS delay value corresponds to location number "+13," then the mathematical average is "+5," so a final RXDQS delay value of five is determined to be the preferred RXDQS delay value. If the resulting mathematical average is a negative number, then a RXDQS delay value of 0/32 is used.

When M[70:0] is compared to the expected value E[71:1], the first expected data bit is discarded because the delay provided by RXDQS DLL 322 and 324 is long enough to reach into the next bit value of the burst. For example, when reading the data element bit at burst address=5, the data element bit at address=6 will actually be acquired, so M[5] is compared to E[6]. Consequently, M[71] is not compared since there is no written value in memory 130 to which it can be compared.

The amount of time required to train the RXDQS delay and TXDQ delay can be considerably reduced by using an initial working TXDQ delay value of one-half of a unit interval (a TXDQ delay value of approximately 16/32). Algorithm 900 is performed at this initial working TXDQ delay value and if passing values of RXDQS delay are observed, then a final RXDQS delay value can be immediately determined. If however no passing RXDQS delay values are observed, then the TXDQ delay value is changed by first adding a predetermined delay, typically 1/32, to the initial working TXDQ delay value and repeating algorithm 900. If passing RXDQS delay values are still not observed, then the TXDQ delay is changed by subtracting a predetermined delay, typically 1/32, from the initial working TXDQ delay value, and again repeating algorithm 900. This process is repeated, each time using a TXDQ delay value that progressively diverges from the initial working value until passing RXDQS delay values are observed. For example, after the initial working TXDQ delay value of 16/32 is tested, the following TXDQ delay values can be 17/32, 15/32, 18/32, 14/32, and so on. Once a final RXDQS delay value has been determined, this final RXDQS delay value can be used to determine the range of passing TXDQ delay values. The range of passing TXDQ delay values can then be approximately bisected to provide a final TXDQ delay value.

Figure 10:
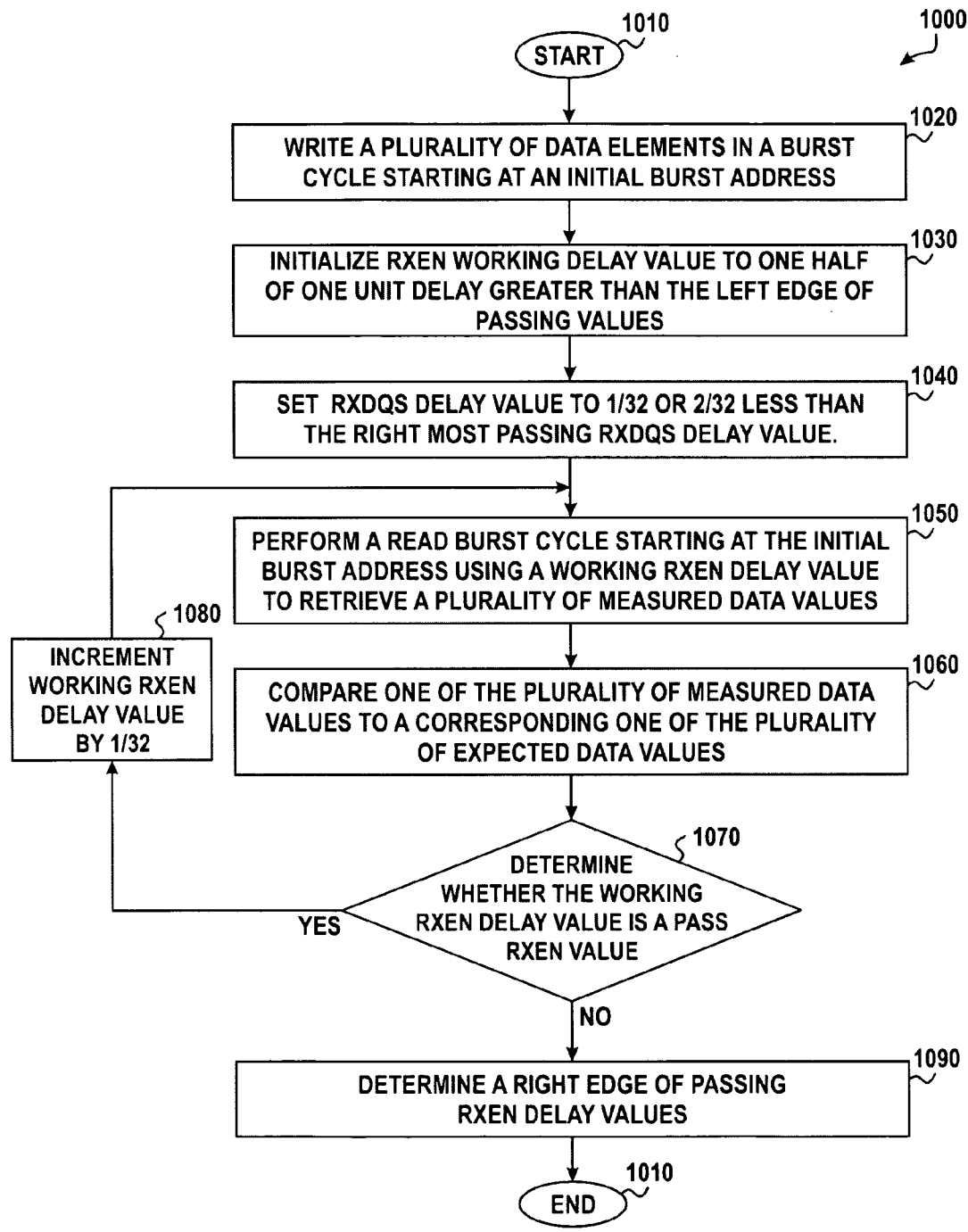
FIG. 10 illustrates a flow diagram with details of a third portion of the method of FIG. 5.

Having completed RXDQS and TXDQ training at step 540, FIG. 10 illustrates, in flow diagram form, the algorithm 1000 for determining the right edge of passing RXEN delay values 550. The flow starts at step 1010 and proceeds to step 1020 wherein a plurality of data elements are written in a burst cycle starting at an initial burst address. The flow proceeds to step 1030 wherein a RXEN working delay is initialized to a value determined by adding a half of a unit interval to the delay corresponding to the left edge of passing RXEN delay value determined in step 530 at FIG. 5 and algorithm 600 at FIG. 6. The flow proceeds to step 1040 wherein a working RXDQS delay value is set to a value determined by subtracting either $\frac{1}{32}$ or $\frac{2}{32}$ from the delay value corresponding to right edge of passing RXDQS delay value determined in algorithm 900. The flow proceeds to step 1050 wherein a read burst cycle is performed starting at the initial burst address of step 1020 using the current working RXEN delay value to retrieve a plurality of measured data values. The flow proceeds to step 1060 wherein one of the plurality of measured data values is compared to a corresponding one of the plurality of expected data values. The flow proceeds to decision step 1070 wherein it is determined whether the current working RXEN delay value is a pass value based on the comparison at step 1060. If the RXEN delay value is a pass value, then the flow proceeds to step 1080 wherein the working RXEN delay value is incremented by $\frac{1}{32}$ and then proceeds back to step 1050. If the RXEN delay value is a fail value, then the flow proceeds to step 1090 wherein the right edge of passing RXEN delay values is determined. The flow ends at step 1110.

More particularly, algorithm 1000 determines the right edge of passing RXEN delay values by first performing three write bursts starting at an initial burst address. RXEN delay is initialized to a value determined by adding a half of a unit interval (one half of a PCLK cycle) to delay corresponding to the left edge of passing RXEN delay value determined in step 530 at FIG. 5 and algorithm 600 at FIG. 6. A RXDQS working delay value is set to a value determined by subtracting either $\frac{1}{32}$ or $\frac{2}{32}$ from the delay value corresponding to the right edge of passing RXDQS delay values determined in algorithm 900. RXEN delay value includes a course delay (multiples of a PCLK cycle) and a fine delay ($\frac{1}{32}^{nd}$ to $\frac{31}{32}^{nd}$ of a PCLK cycle). A read operation is now performed starting at the initial burst address of step 1020. The read operation uses the initial RXEN delay value, and the retrieved data value (measured value) is compared to the previously written data value (expected value). If the measured data value matches the expected value, then the current RXEN delay value is determined to be a passing value. If the measured data value does not match the expected value, then the current RXEN delay value is determined to be a failing value. The RXEN delay value is incremented by $\frac{1}{32}$ and a second read operation and second compare are performed. Incrementing RXEN delay value, reading, and comparing continues until a comparison results in a fail. The RXEN delay value corresponding to the last passing value can be referred to as the right edge of the passing RXEN delay values, and corresponds with the right edge of the RXDQS preamble. All DQ signal lines of a byte lane are trained in parallel.

Having identified the left edge of passing RXEN delay values and the right edge of passing delay values, a final RXEN delay value can now be determined. The final RXEN delay value is set substantially halfway between the left edge of passing values and the right edge of passing values, which corresponds to approximately the middle of the RXDQS preamble.

The reason for using a RXDQS working delay value that places the strobe $\frac{1}{32}$ to $\frac{2}{32}$ less than the delay value corresponding to the right edge of passing RXDQS delay values is due to what happens when the RXEN delay value is such that RXEN is asserted to the right of the right side of the DQS preamble. In this situation, data DQ is effectively latched by latches 326 and 328 by RXEN rather than DQS. Thus, the sampling of DQ is delayed by an interval of time equal to the difference between the rise of DQS and the rise of RXEN. By using a RXDQS working delay value that places the strobe $\frac{1}{32}^{nd}$ to $\frac{2}{32}^{nd}$ of a unit interval less than the delay value corresponding to the right edge of the DQ eye, RXEN will pass the right side of the DQS preamble by $\frac{1}{32}^{nd}$ or $\frac{2}{32}^{nd}$ of a unit interval, respectively. This ensures that when one searches for the right edge of passing RXEN delay values, one will have found the right edge side of the DQS preamble within approximately $\frac{1}{32}^{nd}$ or $\frac{2}{32}^{nd}$ of a unit interval.

The algorithms described herein are applicable for both DDR2 and DDR3 memory standards. However the RXEN and TXDQ delay values specified in the training algorithm represent normalized values of the values actually used when training the DRAM controller to operate with DDR3 memories. An additional "bias delay," introduced by signal routing topology within a DDR3 memory, is accounted for at step 520 at FIG. 5. This bias delay is added to the normalized delay values referred to in FIGS. 6-10 to determine the actual delay values input to the corresponding DLLs. Note that the bias delay can exceed a unit interval.

In the illustrated embodiment, the training algorithms described are repeated for each byte lane and for each chip select. A DIMM typically has up to two chip selects.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method of training a receive enable delay in a double data rate (DDR) dynamic random access memory (DRAM) controller, comprising:
    writing a plurality of data elements in a burst cycle to a burst address over a memory interface for storage in a DRAM;
    performing a read burst cycle from said burst address over said memory interface using a receive enable delay value to retrieve a plurality of measured data values;
    comparing one of said plurality of measured data values that is not a first one of said plurality of measured data values to a corresponding one of said plurality of data elements; and
    determining whether said receive enable delay value is a pass receive enable delay value based on said comparing.

2. The method of claim 1, wherein said burst data cycle comprises four beats, and said comparing comprises:

comparing a third one of said plurality of measured data values to a corresponding third one of said plurality of data elements.

3. The method of claim 1, wherein said burst data cycle comprises four beats, and said comparing comprises:
comparing a second one of said plurality of measured data values to a corresponding second one of said plurality of data elements.

4. The method of claim 1, further comprising:
repeating said performing said read burst cycle, said comparing, and said determining for a plurality of receive enable delay values; and
determining a left edge of passing receive enable delay values in response to said repeating.

5. The method of claim 4, further comprising training a receive data strobe delay value and a transmit data delay value after said determining said left edge of passing receive enable delay values in response to said repeating.

6. The method of claim 5, wherein said training said receive data strobe delay comprises:
writing a plurality of data elements in a burst cycle starting at an initial burst address over a memory interface for storage in a DRAM, wherein alternating ones of said plurality of data elements have different values;
for each of a plurality of values of the receive data strobe delay:
performing a read burst cycle starting at said initial burst address over said memory interface using a selected receive enable delay value to retrieve a measured data value;
comparing said measured data value to an expected value of a corresponding one of said plurality of data elements to provide a first comparison result; and
comparing said measured data value to an expected value of a corresponding next one of said plurality of data elements to provide a second comparison result, and
determining a final receive data strobe delay value using said first and second comparison results.

7. The method of claim 6, further comprising:
for each of a plurality of transmit data delay values:
writing a second plurality of data elements in a burst cycle starting at said initial burst address over said memory interface for storage in said DRAM using a corresponding one of said plurality of transmit data delay values;
performing a second read burst cycle starting at said initial burst address over said memory interface using said final receive data strobe delay value to retrieve a second measured data value; and
comparing said second measured data value to an expected value of a corresponding one of said second plurality of data elements to provide a third comparison result, and
determining a final transmit data delay value using said third comparison result for each of said plurality of transmit data delay values to determine a final transmit data delay value.

8. The method of claim 5, further comprising:
determining a right edge of passing receive enable delay values.

9. The method of claim 8, wherein said determining said right edge of passing receive enable delay values comprises:
adding a half of a unit interval to said left edge of passing receive enable delay values to obtain a working value of said receive enable delay; and
determining said right edge of passing receive enable delay values by starting with said working value.

10. The method of claim 4, further comprising:
determining a right edge of passing receive enable delay values; and
setting a final receive enable delay value in response to said determining said left edge of passing receive enable delay values and said determining said right edge of passing receive enable delay values.

11. The method of claim 10, wherein said setting comprises:
setting said final receive enable delay value substantially halfway between said left edge of passing receive enable delay values and said right edge of passing receive enable delay values.

12. The method of claim 1, further comprising storing a plurality of instructions for said writing, said performing said read burst cycle, said comparing, and said determining in a basic input-output system (BIOS) memory.

13. A method of training a receive data strobe delay in a double data rate (DDR) dynamic random access memory (DRAM) controller, comprising:
writing a plurality of data elements in a burst cycle starting at an initial burst address over a memory interface for storage in a DRAM, wherein alternating ones of said plurality of data elements have different values;
for each of a plurality of values of the receive data strobe delay:
performing a read burst cycle starting at said initial burst address over said memory interface using a selected receive enable delay value to retrieve a measured data value;
comparing said measured data value to an expected value of a corresponding one of said plurality of data elements to provide a first comparison result; and
comparing said measured data value to an expected value of a corresponding next one of said plurality of data elements to provide a second comparison result, and
determining a final receive data strobe delay value using said first and second comparison results.

14. The method of claim 13, wherein said determining comprises:
forming a first mapping of said first comparison result of each of said plurality of values of the receive data strobe delay;
forming a second mapping of said second comparison result of each of said plurality of values of the receive data strobe delay;
concatenating said first mapping after an end of said second mapping to provide a final mapping; and
determining said final receive data strobe delay value using said final mapping.

15. The method of claim 14, wherein said determining said final receive data strobe delay value using said final mapping comprises:
determining said final receive data strobe delay value at substantially a middle of a range of passing values of said final mapping.

16. The method of claim 13, further comprising storing a plurality of instructions for said writing, said performing, said comparing said measured data value to said expected value of said corresponding one of said plurality of data elements, said comparing said measured data value to said expected value of said corresponding next one of said plurality of data elements, and said determining in a basic input-output system (BIOS) memory.

17. The method of claim 13, further comprising:
for each of a plurality of transmit data delay values:
- writing a second plurality of data elements in a burst cycle starting at said initial burst address over said memory interface for storage in said DRAM using a corresponding one of said plurality of transmit data delay values;
- performing a second read burst cycle starting at said initial burst address over said memory interface using said final receive data strobe delay value to retrieve a second measured data value; and
- comparing said second measured data value to an expected value of a corresponding one of said second plurality of data elements to provide a third comparison result, and determining a final transmit data delay value using said third comparison result for each of said plurality of transmit data delay values to determine a final transmit data delay value.

18. The method of claim 13, further comprising:
initializing a working transmit data delay value to half of a unit
interval prior to said writing; and
changing said working transmit data delay value to progressively diverging values and repeating said writing, performing said read burst cycle, comparing said measured data value to said expected value of said corresponding one of said plurality of data elements, and comparing said measured data value to an expected value of a corresponding next one of said plurality of data elements until said first and second comparison results for one of said plurality of values of said receive data strobe delay pass.

19. The method of claim 18, wherein said changing said working transmit data delay value to progressively diverging values comprises alternatingly adding to and subtracting from said working transmit data delay value a value equal to a predetermined delay.

20. A method of training timing delays in a double data rate (DDR) dynamic random access memory (DRAM) controller comprises:
- determining a left edge of passing receive enable delay values;
- training a final value of a receive data strobe delay value and a final value of a transmit data delay value;
- determining a right edge of passing receive enable delay values using a working value of said receive data strobe delay; and
- setting a final receive enable delay value intermediate between said left edge of passing receive enable delay values and said right edge of passing receive enable delay values.

21. The method of claim 20, further comprising:
setting a working value of said receive enable delay based on said left edge, and
wherein said training comprises:
performing said training using said working value of said receive enable delay.

22. The method of claim 20, further comprising storing a plurality of instructions for performing said determining said left edge, training, determining said right edge, and setting in a basic input-output system (BIOS) memory.

23. The method of claim 20, further comprising:
setting said working receive data strobe delay value as a different value than said final receive data strobe delay value.

* * * * *